United States Patent [19]

Arvanitis et al.

[11] Patent Number: 5,577,308
[45] Date of Patent: Nov. 26, 1996

[54] METHOD OF ROTATING A BECHMANN CURVE OF A QUARTZ STRIP RESONATOR

[75] Inventors: Aristotelis Arvanitis, Addison; Weiping Zhang, Arlington Heights; Kevin Haas, Hoffman Estates, all of Ill.

[73] Assignee: Motorola, Inc., Schaumburg, Ill.

[21] Appl. No.: 396,397

[22] Filed: Feb. 28, 1995

[51] Int. Cl.⁶ .............................. H01L 41/22; G01R 29/22
[52] U.S. Cl. ..................... 29/25.35; 204/192.18; 310/361; 310/365; 310/368; 324/727
[58] Field of Search ................. 29/25.35; 204/192.17, 204/192.18; 310/312, 361, 365, 366, 368; 333/187; 427/100; 324/76.49, 76.51, 727

[56] References Cited

U.S. PATENT DOCUMENTS

| | | | |
|---|---|---|---|
| 3,165,651 | 1/1965 | Bechmann | 310/365 |
| 3,202,846 | 8/1965 | Ballato et al. | 310/365 |
| 4,412,172 | 10/1983 | Vig | 29/25.35 X |
| 4,419,600 | 12/1983 | Sinha | 310/361 |
| 4,625,138 | 11/1986 | Ballato | 310/366 X |
| 4,785,232 | 11/1988 | Ballato et al. | 324/727 |
| 5,078,834 | 1/1992 | Witte | 29/25.35 X |
| 5,473,216 | 12/1995 | Brosig et al. | 310/361 X |

*Primary Examiner*—Peter Vo
*Attorney, Agent, or Firm*—Gary J. Cunningham

[57] ABSTRACT

A method of rotating a non-temperature compensated Bechmann curve of a quartz strip. The method includes the steps of determining (102) whether a crystallographic orientation of an AT cut quartz strip is within a desired specification; selecting (104) a predetermined nominal electrode coverage having a nominal electrode width for an in-specification AT cut quartz strip; and tuning (106) an out of specification crystallographic orientation, by: adjusting (108) the electrode width with respect to the nominal electrode width, to bring the out-of-specification crystallographic orientation of an out-of-specification AT cut crystal quartz to within a desired specification having an in-specification Bechmann curve with an inflection point; and rotating (110) an out-of-specification Bechmann curve about the inflection point to substantially approach the desired in-specification Bechmann curve.

16 Claims, 4 Drawing Sheets

METHOD OF ROTATING A BECHMANN CURVE OF A QUARTZ STRIP RESONATOR

FIELD OF THE INVENTION

The present invention relates generally to quartz strips used in frequency control devices and, in particular, to a method of rotating a Bechmann curve of a quartz strip resonator.

BACKGROUND OF THE INVENTION

The temperature characteristics (TC) or frequency over temperature behavior of quartz resonators depend primarily on the crystallographic orientation of the quartz disks or strips cut. When electrodes are deposited on each side of the strip or disk, piezoelectric resonators are formed.

Efforts are being made in the quartz industry, to achieve an improved TC performance. Designers and manufacturers of quartz resonators are concentrating their efforts on methods for improving the precision and the consistency of cutting quartz disks and quartz strips, to a given (precise) crystallographic orientation. Although some progress has been made in this area, the precision and consistency of quartz cutting and processing is still producing quartz disks and quartz strips with a wide distribution of crystallographic orientations. This wide variation causes quartz disks and strips to be made that are outside certain desired crystallographic orientation specifications. Out-of-specification quartz resonators have undesirable or unusable temperature characteristics (Bechmann curves), that do not meet customer's TC requirements, in certain applications.

Thus, there is a need for an improved method of bringing quartz strips that are outside certain crystallographic specifications for a given application, and depositing electrodes as detailed herein, to in effect, rotate the effective Bechmann curve of the strip resonators, to bring an out-of-specification quartz strip resonator to within a predetermined specification. Accordingly, a method of rotating a Bechmann curve of a quartz strip resonator could lower waste of out-of-specification resonators, and would be considered an improvement over the prior art.

DETAILED DESCRIPTION OF THE PREFERRED EMBODIMENT

Figure 1:
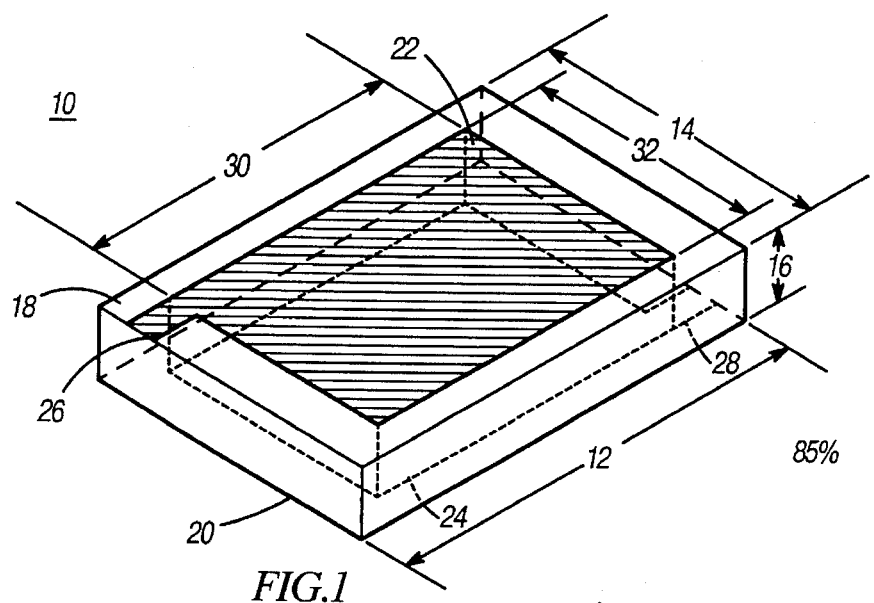
FIG. 1 is an enlarged, simplified perspective view of a quartz strip resonator, with top and bottom electrodes extending laterally across about 85% of the quartz width, in accordance with the present invention.

Referring to FIG. 1, a quartz strip, preferably in the form of an AT cut quartz strip or quartz blank 10 is shown. The quartz strip 10 includes a predetermined quartz length 12, width 14 and thickness 16. FIG. 1 shows a top surface 18 and opposite bottom surface 20 of the quartz strip 10, with top and bottom electrodes 22 and 24 which are substantially co-planar, opposite and co-axial. Tabs 26 and 28 are shown for coupling electrical signals into and out of the respective electrodes 22 and 24. Each electrode 22 and 24 includes an electrode length and width 30 and 32.

Figure 2:
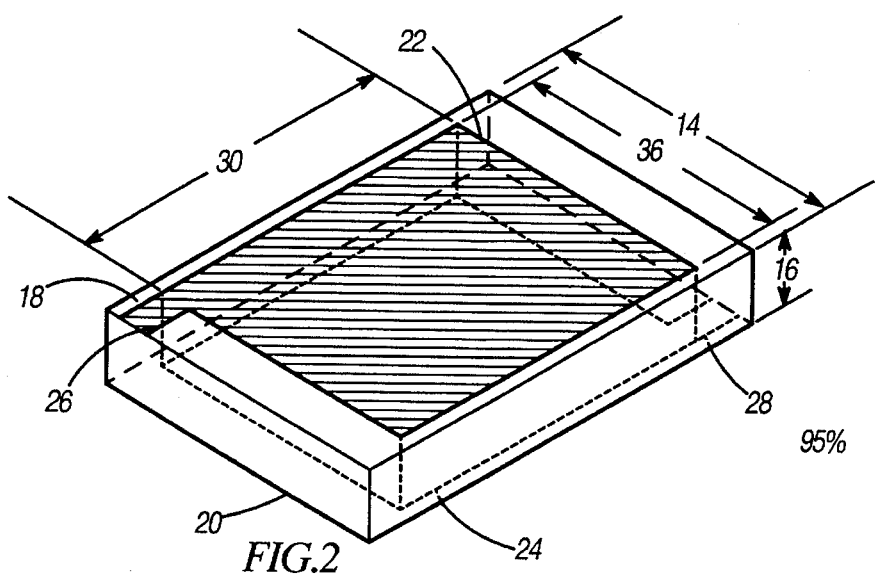
FIG. 2 is an enlarged, simplified perspective view of a quartz strip resonator, with top and bottom electrodes extending laterally across about 95% of the quartz width, in accordance with the present invention.

Referring to FIG. 2, a second quartz strip resonator is shown. The only difference between the first and second quartz strip resonators in FIGS. 1 and 2, is that in FIG. 2 a different or second electrode width 36 is shown. And similarly, in FIG. 3, an electrode is shown which is defined as the third electrode width 34. As an example, FIGS. 1–3 have electrode widths 32, 34 and 36 of 85%, 60% and 95%, of the quartz width 14, respectively. Referring to FIG. 4, several TC curves (third order non-temperature compensated Bechmann curves), as a function of cut angle, are shown. In a preferred embodiment, the desired TC curve could have the specifications, as shown in phantom in this figure. The specification in FIG. 4 require a TC curve within plus or minus 6 parts per million (ppm) between −20° Celcius (C.) to plus 70° C.

For example, four simulated curves 40, 42, 44 and 46 of AT cut crystal strips are shown, which correspond to: 35 degrees, 20 minutes; 35 degrees, 19 minutes; 35 degrees, 18 minutes; and 35 degrees, 17 minutes, respectively.

Referring to FIG. 4, only curves 42 and 44 are within the desired specification (box) of plus or minus 6 ppm, between −20° C. to +70° C. These curves correspond to quartz resonators of crystallographic angles of 35 degrees, 19 minutes and 35 degrees, 18 minutes (curves 42 and 44). Curve 40 is out of the desired specification at higher temperatures, at about 44° C., and curve 46 is out of the desired specification at lower temperatures, such as at about −15° C.

For a radio designer designing a first local oscillator or synthesizer, it would be desirable if every TC curve were within the desired specification, such as that shown in FIG. 4 (i.e., having plus or minus 6 ppm between −20° C. to +70° C.). If the quartz strip resonators supplied to this hypothetical radio designer were within these specifications, there would be little need for external oscillator circuitry to temperature compensate the Bechmann curves (for curves 42 and 44). Thus, the oscillator circuitry could be simpler in construction and less costly. In this example, however, curves 40 and 46 could not be used in this application, without TC circuitry to compensate these Bechmann curves, requiring external circuitry.

In the present invention, these out-of-specification curves 40 and 46 can be utilized in this example, to raise manufacturing yields, and could allow the radio designer to use crystallographic orientation quartz strips ranging from 35 degrees, 20 minutes to 35 degrees, 17 minutes, without rejecting curves 40 and 46. Without this invention, the quartz strips relating to curves 40 and 46 could not be used for this application, without external and complicated temperature compensation circuitry.

The instant invention is adapted to bringing out-of-specification crystallographic orientations of various crystal strips, to within a desired specification, by rotating an out-of-specification Bechmann curve about the inflection point, to substantially approach the desired inspecification Bechmann curve. If curve 40 could be rotated counter-clockwise and curve 46 clockwise, they could be brought within a desired specification, within the box in FIG. 4. The mechanics of how this can be accomplished is the subject of this invention and is detailed herein.

Figure 6:
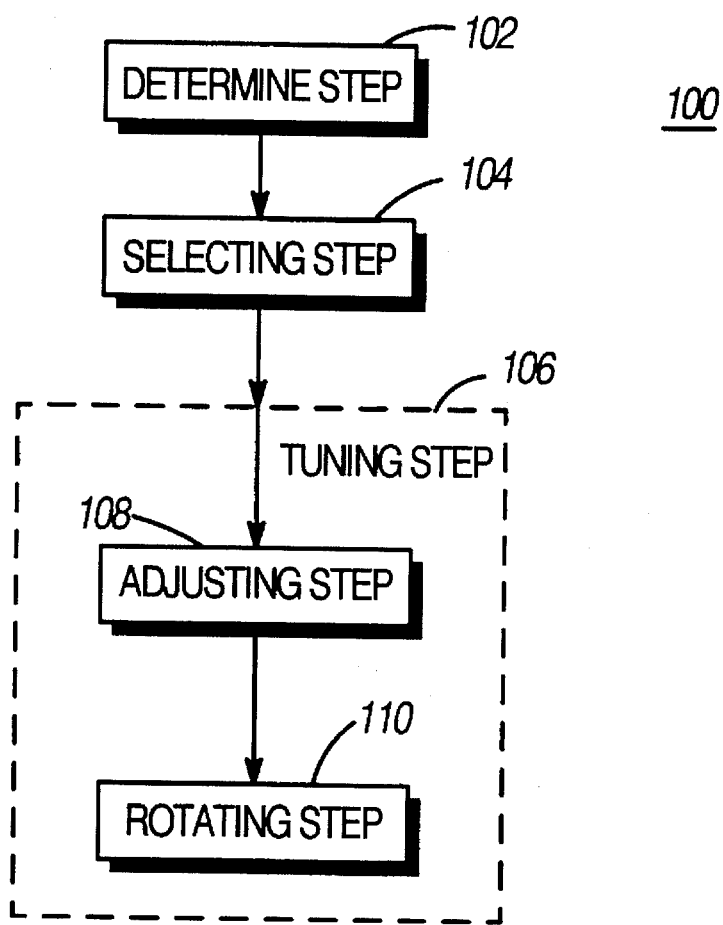
FIG. 6 is a block diagram of a method of rotating the effective Bechmann curve of a quartz strip resonator, in accordance with the present invention.

In FIG. 6, a simplified block diagram of a method of rotating a non-temperature compensated Bechmann curve of a quartz strip resonator, is shown as item 100.

In its simplest form, the method of rotating 100 in FIG. 6, includes: a determining step 102 of determining whether a crystallographic orientation of an AT cut crystal strip is within a desired specification; a selecting step 104 of selecting a predetermined nominal electrode coverage for an in-specification AT cut crystal strip; and a tuning step 106 of tuning an out-of-specification crystallographic orientation. In a preferred embodiment, the tuning step 106 includes: (i) an adjusting step 108 of adjusting the electrode width with respect to the nominal electrode width, to bring the out-of-specification crystallographic orientation of an out-of-specification AT cut crystal strip to within a predetermined specification having a desired in-specification Bechmann curve with a predetermined inflection point; and (ii) a rotating step, as shown by item 110, of rotating an out-of-specification Bechmann curve about the inflection point to substantially approach the desired in-specification Bechmann curve, as shown in the box in FIG. 4.

Rotating Bechmann curves of AT strip resonators which have originally been cut out-of-specification, to within a desired specification, especially after the quartz material has been improperly cut, can have profound effects on lowering the cost of the AT strip resonator. Further, this invention contributes to improving TC performance yields and can contribute to designing oscillators with minimal temperature compensation circuitry, thus lowering the cost of oscillators and radios.

In one case, the tuning step 106 includes, if the nominal electrode width is about 60% or more (the right side of the curve in FIG. 5), rotating clockwise the 5 Bechmann curve about the inflection point of the out-of-specification AT cut crystal strip by increasing the electrode coverage from the nominal electrode coverage, or rotating counter-clockwise the Bechmann curve about the inflection point by decreasing the electrode coverage from the nominal electrode coverage, on the out-of-specification AT cut crystal strip.

Figure 3:
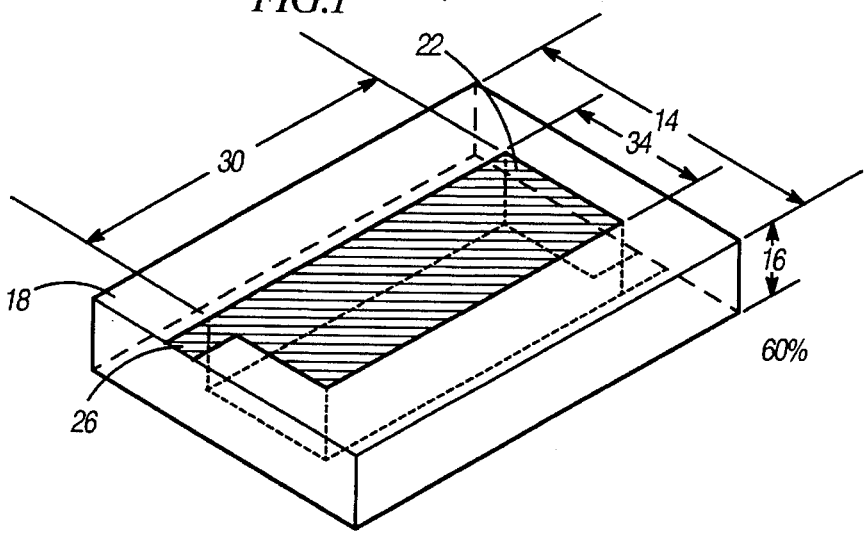
FIG. 3 is an enlarged, simplified perspective view of a quartz strip resonator, with top and bottom electrodes extending laterally across about 60% of the quartz width, in accordance with the present invention.
Figure 4:
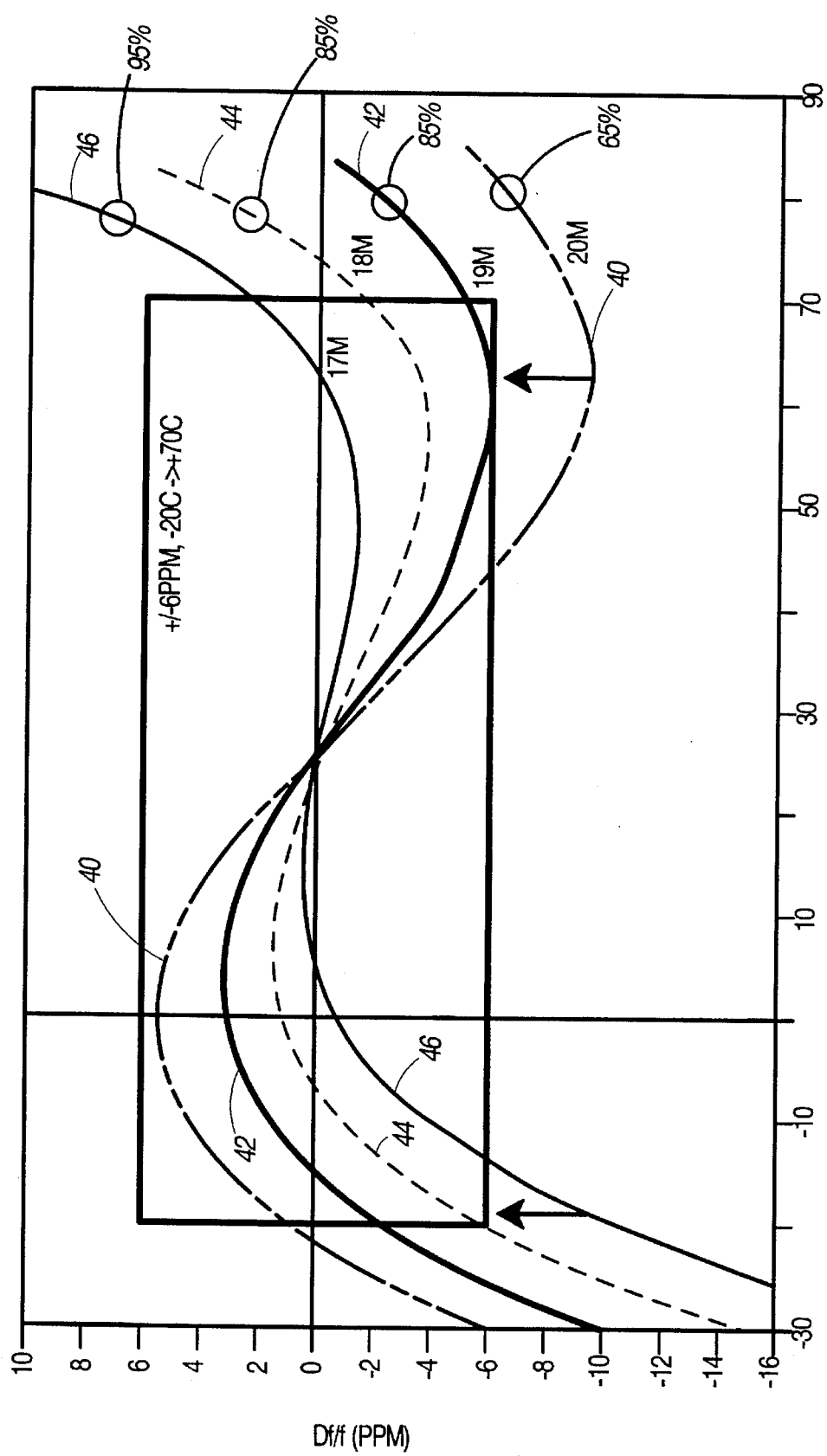
FIG. 4 is a graph showing a plurality of computed strip resonator TC curves as a function of cut angle for a quartz strip resonator, at 16.8 MHz, with a quartz width of 73.8 mils.

In another case, if the nominal electrode width 32 (in FIG. 1) is less than 60% (left side of FIG. 5), the tuning step 106 can involve the Bechmann curve being rotated clockwise about the inflection point for the out-of-specification AT cut crystal strip, by increasing the electrode width (as shown in FIG. 2, for example) from the nominal electrode width (in FIG. 1), and conversely, may be rotated counter-clockwise about the inflection point by decreasing the electrode width (as shown in FIG. 3) from the nominal electrode width (in FIG. 1). In either case, the Bechmann curves 40 and 46 of FIG. 4 can be rotated to provide a resonator with desired specifications, in the box. However, the crystallographic orientation remains unchanged.

As background information, for a given AT cut quartz strip resonator design, there can be found many width dimensions (i.e., width to thickness ratios) where frequency over temperature performance can be characteristically substantially free of resistance or frequency perturbations, and the purity of these Bechmann curves can resemble conditions similar to those of infinite plate designs or round blanks.

The width to thickness ratio solutions can be found via theoretical and/or computer analysis using various known algorithms or by empirical methods, where a large number of devices with different width to thickness ratios for a given frequency can be built. The dimensions providing the best results are then used as the nominal design. These conventional methods have been used to design AT cut strip resonators. The electrode coverage on these conventional AT-strip resonators have been such that in the width dimension of the quartz, the electrode covers as much an area as practically possible, and it is designed to substantially always have the same electrode coverage for a given design for a predetermined frequency.

Because Thickness Shear motion of an AT-cut strip resonator couples to other modes of vibration, however weak the coupling may be, the TC performance of the strip resonator can be adversely influenced by this coupling phenomina. The TC behavior of the other modes of vibration (flexure mode) can have different slopes or rates of change then the Thickness Shear mode of vibration. This weak coupling, will be at a maximum when the electrode area covers 100% of the quartz's width and it will be much lower when the electrode's area is a small percentage of the strip's width. As a result of this coupling behavior, an AT-cut strip resonator can be designed such that the "effective" crystallographic angle (with it's respective Bechmann curve), can be altered. In accordance with the invention, this can be accomplished by changing the percentage of the electrode width coverage, although the actual crystallographic orientation remains fixed.

Figure 5:
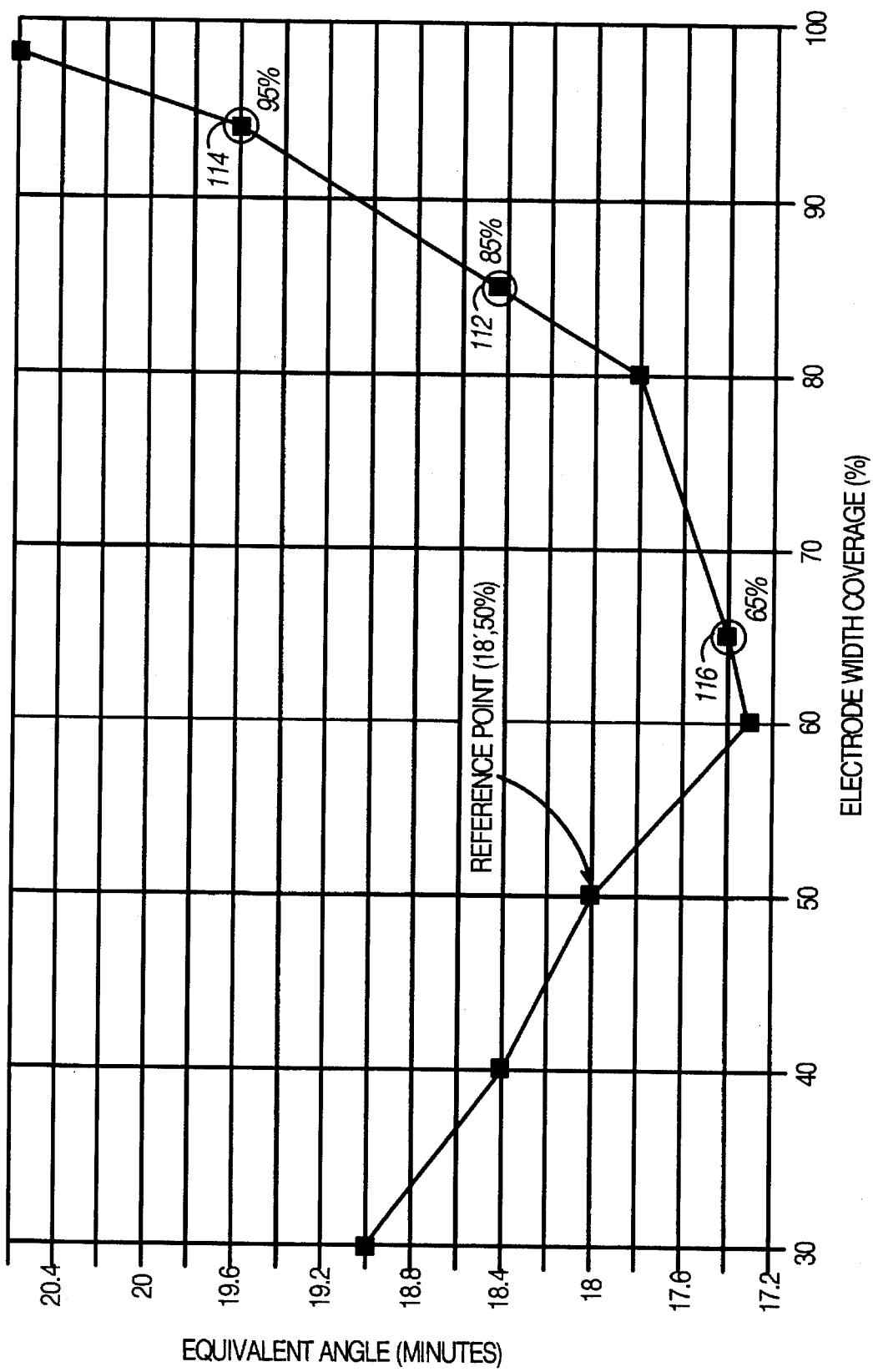
FIG. 5 is a computer-simulated correlation curve between apparent angle and electrode width coverage of a quartz strip resonator, in accordance with the present invention.

FIG. 5 shows the relationship of the apparent angle of an AT-cut strip resonator, as a function of the electrode with coverage (the quartz's crystallographic angle remains fixed). Stated another way, for an AT-cut strip resonator design at 16.8 MHz and with a quartz width of 73.8 mils, and with a fixed crystallographic quartz angle of 35 degrees, 18 minutes, it can be made to behave as if the crystallographic angle were varied, for example, between 35 degrees, 17.4 minutes to about 35 degrees, 20.4 minutes (about a 3 minute equivalent variation), by varying the electrode width coverage from about 65%, identified as point 116 to about 100%, above and to the right of point 114 in FIG. 5.

Referring to FIGS. 4 and 5, in the nominal example design at 16.8 MHz with an electrode coverage of 85% and physical crystallographic orientation between 35 degrees, 17 minutes to 35 degrees, 20 minutes, the TC specifications of curves 40 and 46 are out of the desired frequency-temperature specification box. If, however, the electrode coverage for curve 40 (35 degrees, 20 minutes), were changed to a coverage of about 65% (point 116 in FIG. 5), the apparent angle rotation from FIG. 5 will be about 1 minute lower than the actual angle, thus it will behave like an AT cut strip resonator of a crystallographic orientation equal to that of about 35 degrees, 19 minutes, (similar to curve 42), and therefore it will effectively, be within the desired specifications. Similarly, in curve 46 (35 degrees, 17 minutes), which is out-of-specification at about −15° C., if the electrode coverage area is changed from its nominal 85% (point 112) to about 95% (point 114), and the effective crystallographic angle would be rotated by about 1 minute about 35 degrees, 18 minutes (similar to curve 44), and therefore it would be within the specification box, in FIG. 4.

More particularly, the out-of-specification curves 40 and 46 can be brought to within specification, by changing the electrode width coverage, as detailed herein above. Thus, the curve 40 can be rotated counter clockwise to make it appear similar to curve 42 and within specification, and similarly, curve 46 can be rotated clockwise and be made to look like curve 44, and within specification. Therefore, in this example, the quartz width with the crystallographic orientations of 35 degrees, 20 minutes and 35 degrees, 17 minutes corresponding to curves 40 and 46, that could not have been used in this application in the prior art and may have been wasted, can now be made to meet the desired specification (in FIG. 4), by varying the electrode width coverage. Thus, this method can help to increase manufacturing yields and lower product costs of AT-cut strip resonators.

In a preferred embodiment, the tuning step 106 includes plating both sides of the out-of-specification AT cut quartz strip with about 60% to about 95% electrode width 34 or 36 of the quartz width 14, similar to that shown in FIGS. 2 or 3, for example.

Generally, the wider electrode area coverage is preferred as it produces motional parameters (lower motional inductance and therefore wider frequency pullability) that are more desirable than those motional parameters of strip resonators designed with smaller electrode areas.

The tuning step 106 includes providing a resonator having a frequency of about 16.8 megahertz (MHz), 15.36 MHz, 14.4 MHz, or 12.8 MHz.

As should be understood by those skilled in the art, various AT-cut strip resonator frequencies can be used herein, however, these listed above are preferred, as they are standard oscillator frequencies used by a number of radio manufacturers and therefore a higher demand exists for these frequencies than other non-standard frequencies.

The adjusting step 108 can include providing various geometric electrode shapes, so long as they have the desired specifications. In one embodiment, the geometric shape of the electrodes are substantially rectangular or trapezoidal, and preferably rectangular because motional parameters of a strip resonator with a fixed quartz width with rectangular electrodes, contribute to producing resonators with desirable motional inductance and motional resistance, which can be lower than other shaped electrodes, such as trapezoidal, and therefore are desirable for use in oscillator circuitry.

The adjusting step 108 can also include providing at least one electrode that is substantially rectangular and substantially centered along a center longitudinal axis of the AT cut quartz strip 10. A centered electrode provides a symmetry (equal distance from the edges of the quartz), which symmetry can substantially contribute to minimizing coupling of other undesirable modes of vibration into the thickness shear mode of vibration, thus producing a resonator with improved Bechmann curves substantially free of frequency perturbations. Thus, the symmetric feature is desirable for resonators that are used in very tight tolerance oscillators.

The determining step 102 can include measuring the crystallographic orientation of the AT cut quartz strip in various conventional ways, preferably with a conventional X-ray technique known in the industry.

The adjusting step 108 can further include adjusting the out-of-specification (crystallographic orientation crystal) electrode length, whereby the electroded area remains substantially similar to the nominal electrode coverage. Worded differently, the adjusting step can comprise adjusting the electrode width and electrode length, whereby the electroded area remains substantially constant.

By keeping the electrode area substantially constant, the motional parameters of the resonator, such as motional inductance, motional resistance and pullability (delta f/f), will remain substantially the same for different electrode width and length ratios. Thus, for various different electrode width and lengths (so long as area remains substantially the same), the same temperature compensation schemes can be used. Stated another way, with a constant electrode area, the Bechmann curves can be rotated to approach and be in the desired specification, while also being able to utilize standard temperature compensation circuitry for an oscillator.

EXAMPLES 1 AND 2

In these examples, two out-of-specification AT cut quartz strips are shown as curves 40 and 46. The first curve 40 and fourth curves 46 have crystal orientations of 35 degrees, 20 minutes and 17 minutes, respectively. (Since curves 42 and 44 corresponding to crystal orientation of 35 degrees, 19 and 20 minutes, are properly oriented and within the desired specifications (in the box in FIG. 4), no rotating is necessary.) Thus, the first step of determining whether a crystallographic orientation of an AT cut quartz strip is within desired specification, has been accomplished.

The next step is to select a predetermined nominal electrode width for an in-specification AT cut quartz strip. In this example (as shown in FIG. 1 and FIGS. 4 and 5), the nominal electrode width 32 is 85% of the quartz width 14.

Next, a tuning step is involved to tune the out-of-specification crystallographic orientation. Thus, in Example 1 curve 40 (35°, 20 minutes) is rotated counter-clockwise (to approach curve 42) to bring curve 40 within a desired specification in the box in FIG. 4. In order to rotate curve 40, the electrode width has to be adjusted with respect to the nominal electrode width 32 (FIG. 1) (point 112 in FIG. 5). More particularly, the electrode width would be decreased from the nominal width 32 to width 34 in FIG. 3 (comprising about 60%) (approximately point 116) to within a predetermined specification having a desired in-specification Bechmann curve (in FIG. 4).

In Example 2, curve 46 is rotated clockwise and brought in-specification by increasing the electrode width to 95% (point 114 in FIG. 5), as shown in FIG. 2.

Thus, a resonator having a frequency of about 16.8 MHz is thus attainable, notwithstanding starting with an out-of-specification crystal orientation. These examples have been detailed previously.

Although the present invention has been described with reference to certain preferred embodiments, numerous modifications and variations can be made by those skilled in the art without departing from the novel spirit and scope of this invention.

What is claimed is:

1. A method of rotating a non-temperature compensated Bechmann curve of a quartz strip resonator, comprising the steps of:

determining whether an AT cut quartz strip has an out-of-specification crystallographic orientation;

selecting a predetermined nominal electrode coverage having a nominal electrode width for an in-specification AT cut quartz strip; and tuning the out-of-specification crystallographic orientation, by:

adjusting the electrode width with respect to the nominal electrode width, to bring the out-of-specification crystallographic orientation of an out-of-specification AT cut crystal quartz to within a predetermined specification having a desired in-specification Bechmann curve with an inflection point; and rotating an out-of-specification Bechmann curve about the inflection point to substantially approach the desired in-specification Bechmann curve.

2. The method of claim 1, wherein the tuning step includes:

(a) if the nominal electrode width is about 60% or more, rotating clockwise the Bechmann curve about the inflection point of the out-of-specification AT cut crystal strip by increasing the electrode width from the nominal electrode width, or rotating counter-clockwise the third order Bechmann curve about the inflection point by decreasing the electrode width from the nominal width on the out-of-specification AT cut quartz strip; or (b) if the nominal electrode width is less than about 60%, rotating clockwise the Bechmann curve about the inflection point of the out-of-specification AT cut crystal strip by decreasing the electrode width from the nominal electrode width, or rotating counter-clockwise the third order Bechmann curve about the inflection point by increasing the electrode width from the nominal electrode width on the out-of-specification AT cut quartz strip.

3. The method of claim 1, wherein the tuning step includes plating both sides of the out-of-specification AT cut quartz strip with an electrode width of about 65% to about 95% of the AT cut quartz width.

4. The method of claim 3, wherein the tuning step includes plating both sides of the out-of-specification AT cut quartz strip with an electrode width of about 85% of the AT cut quartz width.

5. The method of claim 1, wherein the tuning step includes plating both sides of the AT cut quartz strip with about 85% of the AT cut quartz width and providing a resonator having a frequency of at least one of about 16.8 MHz, 15.36 MHz, 14.5 MHz and 12.8 MHz.

6. The method of claim 1, wherein the adjusting step includes providing a geometric electrode shape which is at least one of substantially rectangular and substantially trapezoidal.

7. The method of claim 1, wherein the adjusting step includes providing an electrode that is substantially rectangular and substantially centered along a center longitudinal axis of the AT cut quartz strip.

8. The method of claim 1, wherein the determining step includes measuring the crystallographic orientation of the AT cut quartz strip with an X-ray technique.

9. The method of claim 1, wherein the adjusting step further includes adjusting the out-of-specification electrode length, whereby the electroded area remains substantially similar to the in-specification nominal electrode coverage.

10. The method of claim 1, wherein the adjusting step comprises adjusting an electrode area of the out-of-specification crystallographic orientation of the AT cut quartz strip such that the electrode area is substantially similar to the nominal electroded area of the in-specification AT cut quartz strip.

11. A method of rotating a non-temperature compensated Bechmann curve of a quartz strip, comprising the steps of: determining whether an AT cut quartz strip has an out-of-specification crystallographic orientation;

selecting a predetermined nominal electrode coverage having a nominal electrode width for an in-specification AT cut quartz strip; and tuning the out-of-specification crystallographic orientation, by:

adjusting the electrode width with respect to the nominal electrode width, to bring the out-of-specification crystallographic orientation of an out-of-specification AT cut quartz strip to within a predetermined specification having a desired in-specification Bechmann curve with an inflection point; and rotating an out-of-specification Bechmann curve about the inflection point to substantially approach the desired in-specification third order Bechmann curve, by:

(i) if the nominal electrode width is about 60% or more of a width of the AT cut quartz strip, rotating clockwise the Bechmann curve about the inflection point of the out-of-specification AT cut quartz strip by increasing the electrode width from the nominal electrode width, or rotating counter-clockwise the Bechmann curve about the inflection point by decreasing the electrode width from the nominal electrode width of the out-of-specification AT cut quartz strip; or (ii) if the nominal electrode width is less than about 60% of the width of the AT cut quartz strip, rotating clockwise the Bechmann curve about the inflection point of the out-of-specification AT cut quartz strip by decreasing the electrode width from the nominal electrode width, or rotating counter-clockwise the Bechmann curve about the inflection point by increasing the electrode width from the nominal electrode width of the out-of-specification AT cut quartz strip.

12. The method of claim 11, wherein the tuning step includes positioning electrodes substantially centrally located and centered along a center longitudinal axis of the AT cut quartz strip.

13. The method of claim 11, wherein the tuning step includes plating both sides of the out-of-specification AT cut quartz strip with an electrode width of about 65% to about 95% of the AT cut quartz width.

14. The method of claim 11, wherein the adjusting step further includes adjusting the out-of-specification electrode length, whereby the electroded area remains substantially similar to the in-specification nominal electrode coverage.

15. The method of claim 11, wherein the adjusting step comprises adjusting an electrode area of the out-of-specification crystallographic orientation of the AT cut quartz strip such that the electrode area is substantially similar to the nominal electroded area of the in-specification AT cut quartz strip.

16. The method of claim 11, wherein the tuning step includes plating both sides of the AT cut quartz strip with about 85% of the AT cut quartz width and providing a resonator having a frequency of at least one of about 16.8 MHz, 15.36 MHz, 14.5 MHz and 12.8 MHz.

* * * * *